(12) United States Patent
Mulligan et al.

(10) Patent No.: US 7,230,411 B2
(45) Date of Patent: Jun. 12, 2007

(54) VOLTAGE SENSING APPARATUS FOR MEDIUM-VOLTAGE ELECTRICAL POWER DISTRIBUTION SYSTEMS

(75) Inventors: Timothy J. Mulligan, Glenview, IL (US); James W. Barker, Jr., Niles, IL (US)

(73) Assignee: S&C Electric Co., Chicago, IL (US)

( * ) Notice: Subject to any disclaimer, the term of this patent is extended or adjusted under 35 U.S.C. 154(b) by 0 days.

(21) Appl. No.: 11/304,827

(22) Filed: Dec. 16, 2005

(65) Prior Publication Data

US 2006/0202671 A1 Sep. 14, 2006

Related U.S. Application Data

(60) Provisional application No. 60/639,260, filed on Dec. 28, 2004.

(51) Int. Cl.
*G01R 31/02* (2006.01)
*G01R 31/28* (2006.01)

(52) U.S. Cl. ..................... 324/72.5; 324/530

(58) Field of Classification Search .............. 324/72.5, 324/457, 530
See application file for complete search history.

(56) References Cited

U.S. PATENT DOCUMENTS 4,052,665 A * 10/1977 Gruenwald ................. 324/530
5,172,051 A * 12/1992 Zamborelli ................. 324/72.5
5,293,113 A * 3/1994 Beha et al. ................. 324/72.5
5,512,838 A * 4/1996 Roach ........................ 324/754
5,949,230 A * 9/1999 Kobayashi et al. ......... 324/72.5
6,737,871 B1 * 5/2004 Schneider et al. .......... 324/539

* cited by examiner

*Primary Examiner*—Anjan Deb
(74) *Attorney, Agent, or Firm*—James V. Lapacek

(57) ABSTRACT

A molded voltage sensor is provided that achieves excellent sensing accuracy over a wide temperature range by molding promary and secondary capacitances are of a voltage divider into a solid dielectric material and wherein th e capacitances are preferably fabricated from the same material, or at least materials having nearly identical temperature coefficients of permittivity. In a preferred arrangement, a first member of dielectric material includes a conductive pattern of the outer surface thereof and an electrical connection attached to the conductive pattern. The first memberis the molded into a prerdetermined location with respect to a central conductor and a layer of the dielectric molding material is also molded over the exterior of the first member. Another conductive pattern is formed on the over-molded layer. The overall assembly is then molded to form a body of the sesired shape and provides insulation between the conductor and the conductive patterns.

2 Claims, 3 Drawing Sheets

VOLTAGE SENSING APPARATUS FOR MEDIUM-VOLTAGE ELECTRICAL POWER DISTRIBUTION SYSTEMS

This application claims the benefit of U.S. Provisional Application No. 60/639,260 filed on Dec. 28, 2004.

BACKGROUND OF THE INVENTION

1. Field of the Invention

The present invention relates generally to sensors for the electrical power distribution field and more particularly to a molded voltage sensor that achieves excellent sensing accuracy over a wide temperature range.

2. Description of the Related Art

Various voltage sensing arrangements are known in the electrical power distribution field that utilize molding technology. For example, see the following U.S. Pat. Nos.: 6,031,368; 6,538,422; 5,438,161; 5,162,726, and 4,002,976.

While the prior art arrangements may be useful, it would be desirable to provide a voltage sensor that schieves excellent sensing accuracy over a wide temperature range.

SUMMARY OF THE INVENTION

Accordingly, it is a principal object of the present invention to provide a voltage sensor that achieves excellent sensing accuracy over a wide temperature range.

It is another object of the present invention to provide a molded voltage sensor that provides accurate sensing over a wide temperature range via a fabrication process.

It is a further object of the present invention to provide a molded voltage sensor that is fabricated utilizing several molding steps of the same materials (or materials of similar coefficients of thermal expansion) thus avoiding internal stress problems while achieving accurate sensing over a wide temperature range.

These and other objects of the present invention are efficiently achieved by the provision of a molded voltage sensor that achieves excellent sensing accuracy over a wide temperature range by molding primary and secondary capacitances of a voltage divider into a solid dielectric material and wherein the capacitances are preferably fabricated from the same material, or at least materials having nearly identical temperature coefficients of permittivity. In a preferred arrangement, a first member of dielectric material includes a conductive pattern on the outer surface thereof and an electrical connection attached to the conductive pattern. The first member is then molded into a predetermined location with respect to a central conductor and a layer of the dielectric molding material is also molded over th;e exterior of the first member. Another conductive pattern is formed on the over-molded layer. The overall assembly is then molded to form a body of the desired shape and provides insulation between th;e conductor and the conductive patterns.

BRIEF DESCRIPTION OF THE DRAWING

The invention, both as to its organization and method of operation, together with further objects and advantages thereof, will best be understood by reference to the specification taken in conjunction with the accompanying drawing in which.

DETAILED DESCRIPTION

Figure 1:
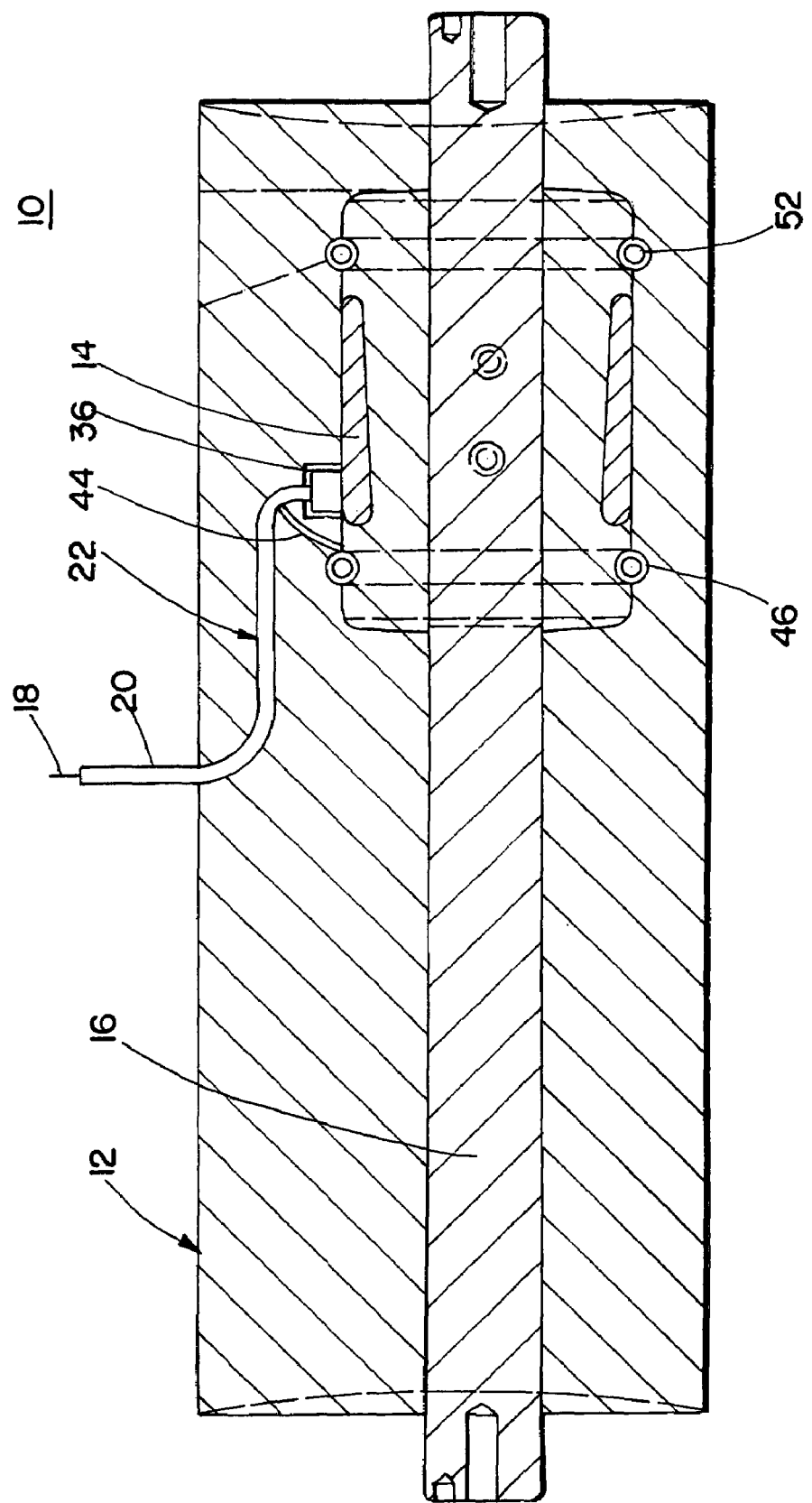
FIG. 1 is an elevational view, partly in section, of a voltage sensor fabricated in accordance with the present invention.

Referring now to FIG 1, a voltage sensor 10 fabricated in accordance with the principles of the present invention includes a molded outer body or housing 12 incorporating an inner member 14 forming a first capactive plate or capacitance with respect to an inner conductor 16 extending through the body 12 and with;in the inner member 14. The output of the voltage sensor 10 is provided via a conductor 18 connected to the inner member 14, e.g. the conductor 18 is a coaxial cable 20 having a shield 22 about the inner conductor 18.

Figure 2:
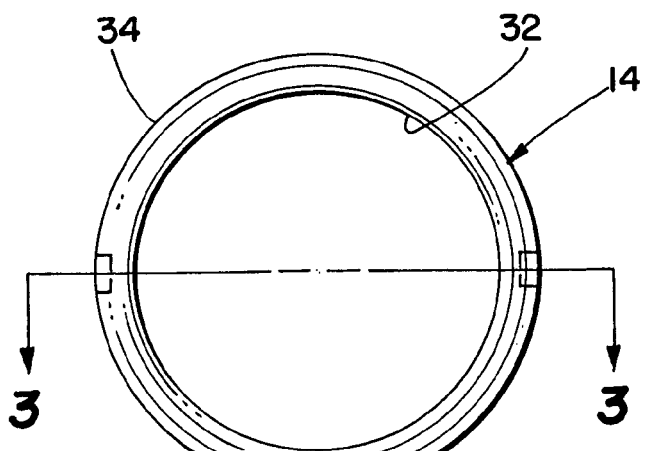
FIG. 2 is a front elevational view of an inner member of the voltage sensor of FIG. 1.
Figure 3:
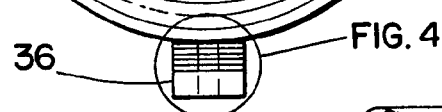
FIG. 3 is a sectional view taken generally along the line 3—3 FIG. 2.
Figure 3:
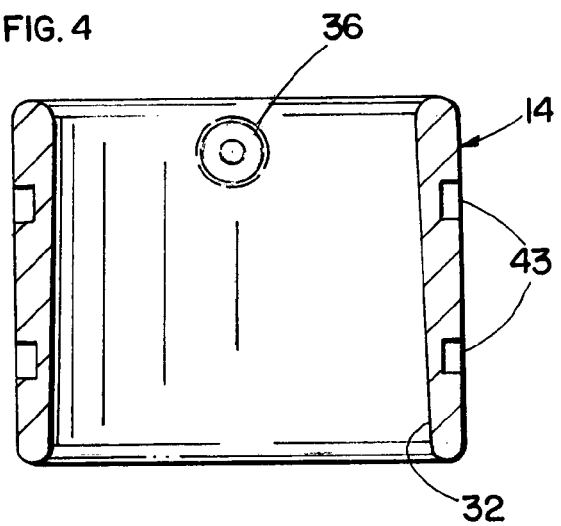
Figure 4:
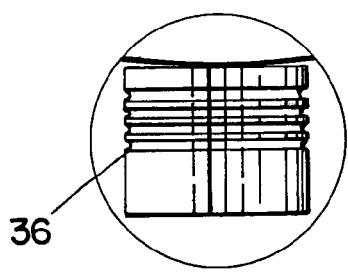
FIG. 4 is an enlarged view of a portion of the inner member of FIG. 2.
Figure 5:
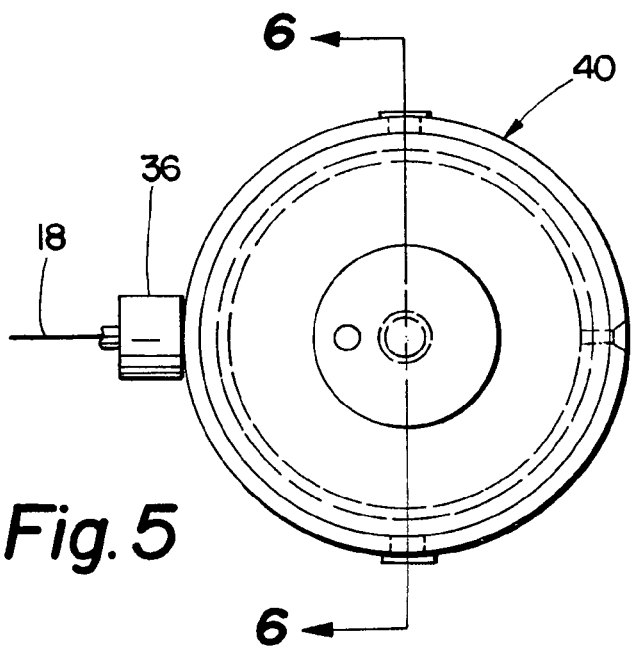
FIG. 5 is a front elevational view of an intermediate molding step of portions of the voltage sensor of FIG. 1.

Referring now to FIGS. 2–4, the inner member 14 is fabricated from a suitable dielectric, e.g. molded of fabricated from cycloaliphatic epoxy resin. The inner member 14 has an inner diameter 32 to accommodate the conductor 16 and an outside diameter 34 to result in suitable capacitance for the voltage sensor 10 as will be explained in more detail hereinafter. The inner member 14 is then appropriately prepared, e.g. by sandblasting, and then coated with a conductive paint to provide a conductive coating at 34, preferably, the inner diameter 32 also being coated to alleviate electrical stress and to maintain desirably high capacitance values of the voltage sensor 10. The inner member 14 also includes facilities at 36 for attachment of a suitable conductor to the conductive coating at 34. For example, and referring now to FIG. 5, the inner conductor 18 of the coaxial cable 20 is connected to the conductive coating 34 via the connector at 36.

Figure 6:
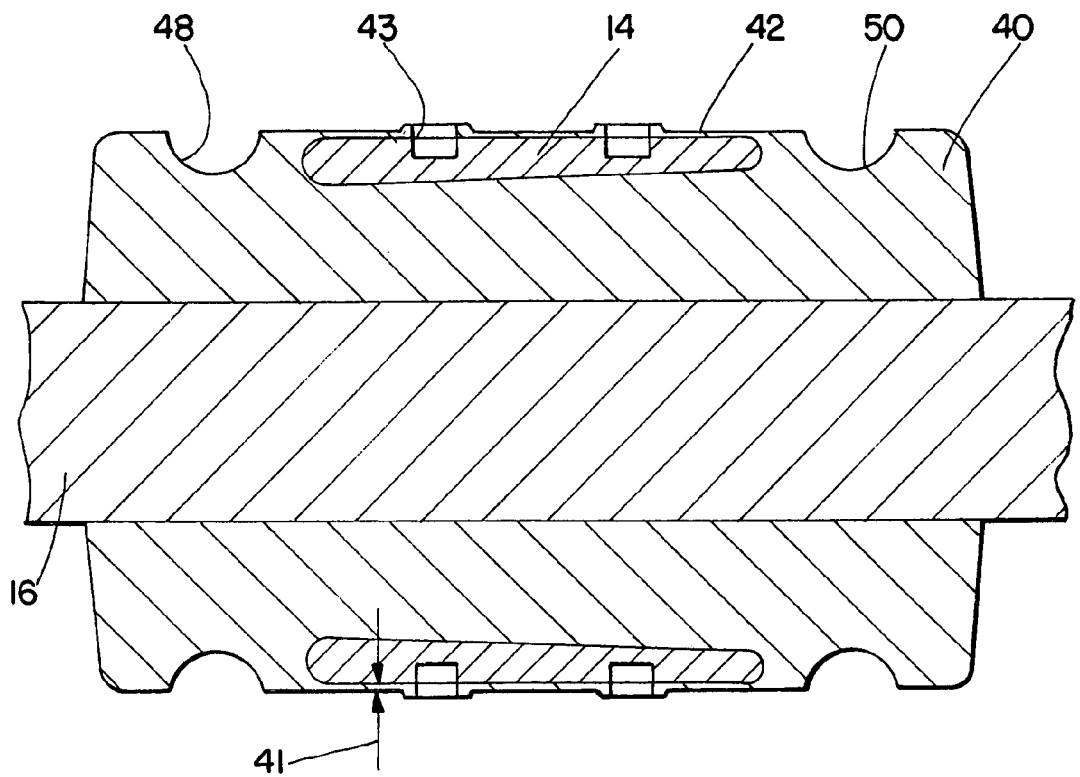
FIG. 6 is a sectional view taken generally along the line 6—6 of FIG. 5.

Considering now the further fabrication of the voltage sensor 10 and referring now to FIG. 6, the conductor 16 is molded within the inside diameter of the inner member 14, and simultaneously, the inner member 14 is also encapsulation of the inner member about the conductor 16 resulting in the defining of an outer member 40 with a predetermined thickness 41 on the outer surface of the inner member 14 to define a suitable capacitance. Further, to facilitate accurate location of the inner member 14 in the molding process and thereby control the thickness of the outer surface 41, recesses 43 (FIGS. 3 and 6) are provided into the surface of the inner member 14. Portions of the outer surface of the encapsulation 40 are prepared, e.g. by sandblasting, and them conductive paint is applied in predetermined areas, e.g. at 42, to form a conductive pattern and forming a capacitor with respect to the conductive coating at 34 on the outer diameter of the inner member 14. As seen in FIG. 1, the shield 22 of the coaxial cable 20 is connected to the area 42 of conductive coating via a wire 44 and a garter spring 46 positioned about the encapsulation 40 and retained within a groove 48 formed in the encapsulation 40, e.g. during the forming thereof. A second groove 50 is formed in the encapsulation 40 to accept a second garter spring 52, the springs 46 and 52 providing a shield function to the edge of the conductive coating of areas 42.

Figure 7:
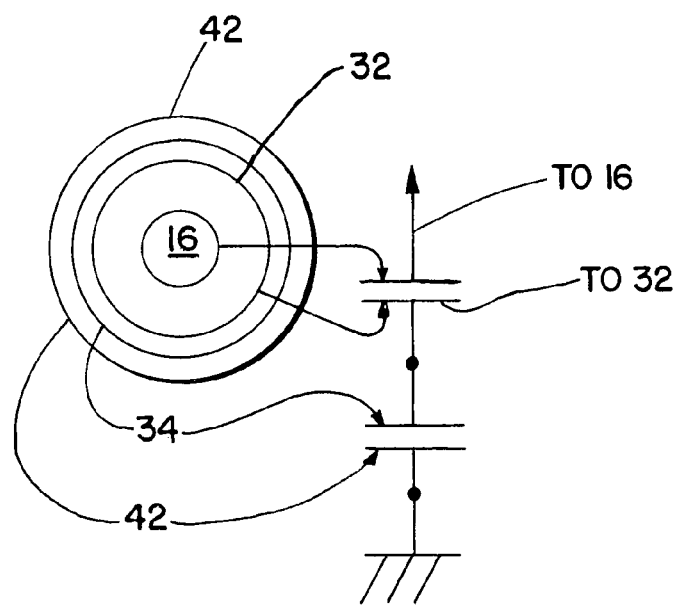
FIG. 7 is a diagrammatic representation and schematic representation of the voltage divider formed within the voltage sensor of FIG. 1.

As shown in FIG. 1, the overall assembly as described thus far is then molded to form the overall body 12 in the desired overall shape for application as the inner member 14 and the encapsulation 40. The body 12 also provides insulation between the conductor 16 and the outer conductive coating at 42 of the formed outer member 40. During the molding of the body 12, the conductor 18 of coaxial cable 20 is directed to the outside of the body 12 to provide the output of the voltage sensor 12 with respect to ground. A schematic representation of the voltage divider formed within the voltage sensor 10 is illustrated in FIG. 7.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

The invention claimed is:

1. A voltage sensor comprising voltage divider capacitors being formed within a molded body comprising:

a first member of dielectric material being of generally cylindrical shape and having a first conductive pattern formed on the exterior thereof and an interconnection facility extending therefrom;

a conductor arranged to extend through the first member;

a molded body of similar dielectric material defined about the conductor and the first member with a second conductive pattern being formed on the exterior of the molded body adjacent the first member and the interconnection facility extending to the exterior of the molded body; and an outer body being formed about the molded body, a first voltage divider capacitor being formed between the conductor and the first conductive pattern, a second voltage divider capacitor being formed between the first and second conductive patterns.

2. The voltage sensor of claim 1 wherein said first member, said molded body and outer body all being the same material.

* * * * *